United States Patent [19]
Yoo et al.

[11] Patent Number: 5,541,131
[45] Date of Patent: Jul. 30, 1996

[54] PEELING FREE METAL SILICIDE FILMS USING ION IMPLANTATION

[75] Inventors: Chue-San Yoo, Taipei; Ting-Hwang Lin, Hsin-Chu, both of Taiwan

[73] Assignee: Taiwan Semiconductor Manufacturing Co., Hsinchu, Taiwan

[21] Appl. No.: 649,549

[22] Filed: Feb. 1, 1991

[51] Int. Cl.⁶ .................................................. H01L 21/336
[52] U.S. Cl. ........................ 437/44; 437/192; 437/200; 437/41; 437/193; 148/DIG. 147
[58] Field of Search ................................ 437/40, 41, 44, 437/34, 57, 192, 200, 24, 193, 40 GS, 41 GS, 41 RL, 41 SM; 148/DIG. 147

[56] References Cited

U.S. PATENT DOCUMENTS

| | | | |
|---|---|---|---|
| 4,690,730 | 9/1987 | Tang et al. | 156/643 |
| 4,729,969 | 3/1988 | Suda et al. | 437/200 |
| 4,740,484 | 4/1988 | Norstrom et al. | 437/44 |
| 4,743,564 | 5/1988 | Sato et al. | 437/192 |
| 4,782,033 | 11/1988 | Gierisch et al. | 437/200 |
| 4,857,484 | 8/1989 | Nishikawa | 327/209 |
| 4,897,368 | 1/1990 | Kobushi et al. | 437/24 |
| 4,908,334 | 3/1990 | Zuhr et al. | 437/200 |
| 4,935,380 | 6/1990 | Okumura | 437/200 |
| 5,013,686 | 5/1991 | Choi et al. | 437/200 |
| 5,024,954 | 6/1991 | Chen et al. | 437/24 |

FOREIGN PATENT DOCUMENTS

| | | | |
|---|---|---|---|
| 0087342 | 7/1981 | Japan | 437/24 |
| 0204743 | 8/1988 | Japan | 437/24 |
| 0082620 | 3/1989 | Japan | 437/24 |
| 0112755 | 5/1989 | Japan | 437/24 |
| 0257642 | 10/1990 | Japan | 437/24 |

*Primary Examiner*—Mary Wilczewski
*Attorney, Agent, or Firm*—George O. Saile

[57] ABSTRACT

A method is described for fabricating a lightly doped drain MOSFET integrated circuit device which overcomes the polycide peeling problems. A pattern of gate electrode structures is formed upon a semiconductor substrate which each includes a gate oxide, a polysilicon layer and an amorphous refractory metal silicide. The resulting structure may be annealed in oxygen at this time to change the refractory metal silicide from it deposited amorphous phase into its crystalline phase. This causes the formation of a thin layer of silicon dioxide upon the exposed silicon substrate, the exposed polysilicon layer and the exposed metal silicide layer. A pattern of lightly doped regions in the substrate is formed by ion implantation using the polycide gate structures as the mask. A dielectric layer is blanket deposited over the surfaces and spacer structures formed by anisotropic etching. A pattern of heavily doped regions in the substrate is formed by ion implantation using the polycide structures with spacer structures as the mask to produce the lightly doped drain source/drain structures of an MOSFET device. The silicon oxide layer on the top surface of the metal silicate layer was removed by etching. Silicon ions are now implanted into the metal silicide layer to supply an excess of silicon ions at the surface of the metal silicide layer. The integrated circuit device is completed by forming a passivation layer over the structures described and appropriate electrical connecting structures thereover.

19 Claims, 2 Drawing Sheets

PEELING FREE METAL SILICIDE FILMS USING ION IMPLANTATION

BACKGROUND OF THE INVENTION

1. Field of the Invention

The present invention relates to methods for producing integrated circuit devices having lightly doped drain MOSFET with refractory metal polycide gate structures and methods for successfully forming a conductive contact to metal silicide conductive lines.

2. Description of the Prior Art

The use of polycide gates or interconnect lines, that is a combination of layers of polysilicon and a refractory metal silicide is becoming very important as the industry moves to smaller device geometries. In the past, polysilicon was satisfactory as the gate electrodes and for interconnecting lines. However, as these geometries become smaller, polysilicon has become too high in resistivity for these applications due to its affect on RC time delays and IR voltage drops. The use of a combination of refractory metal silicides with polysilicon has proven suitable because of its lower resistivity.

Silicides of certain refractory metals, i.e. tungsten, molybdenum, titanium, and tantalum have been proven to be suitable for use as a low resistance interconnect material for VLSI integrated circuit fabrication. The disilicides pair very well with heavily doped polysilicon to form polycide gates, because of the criteria of low resistivity and high temperature stability. Tungsten silicide has particularly been found to be capable of overcoming some shortcomings, such as self-passivation, good stability in wet chemical ambients, adhesion, and reproducibility in combination with polysilicon in production.

The preferred deposition technique of tungsten silicide is low pressure chemical vapor deposition. The oxidation characteristics of tungsten silicide as produced by this method are similar to those of polysilicon.

The peeling of the polycide film can happen frequently if care is not taken during processing and handling of the wafers. This in turn causes the low yield of the product. This peeling and/or less integrity of the silicide problems are often observed after thermal treatments.

The conventional polycide process forms sequentially the gate oxide layer by thermal oxidation, the polysilicon layer which is then doped, and the refractory metal silicide in situ. The refractory metal silicide and polysilicon layer deposition and the doping of the polysilicon are normally not done in the same reaction chamber. These layers are now anisotropically etched in the desired pattern of polycide gate structures. An annealing step in oxygen causes the amorphous refractory metal silicide to change into its crystalline phase. During this annealing process, silicon dioxide is grown upon the surfaces of the polycide and exposed silicon substrate. A pattern of lightly doped regions in the substrate is formed by ion implantation using said gate electrode structures as the mask. The dielectric spacer is formed by blanket chemical vapor deposition of silicon dioxide, a heat densification step and an anisotropic etching of the silicon dioxide layer. The N+ implant is then carried out, followed by the conventional dopant annealing step. The result of this process is all too often the peeling of the refractory metal silicide.

The workers in the field have tried to overcome this problem by capping with silicon dioxide during the reaction of titanium with the underlying polysilicon layer such as shown by T. E. Tang et al. in U.S. Pat. No. 4,690,730. This did suppress peeling for this type of process, however the major reason for the silicon dioxide layer is to prevent the titanium from being oxidized by oxygen.

Similar peeling problems have occurred when attempting to make electrical contact to a metal silicide through a glasseous passivation layer after the conventional glass flow step to cause the rounding of the corners of opening through the glasseous layer with elevated heating temperatures.

Workers in the art have used the implantation of silicon ions in the manufacture of integrated circuits. K. Suda et al U.S. Pat. No. 4,729,969 describes implanting silicon ions into the area of undulating film adjacent to the contact hole area prior to a conformal deposition of metal. An annealing step is carried out to form the silicide. R. A. H. Heinecke U.S. Pat. No. 4, 908,334 describes making an aluminum alloy by implanting silicon ions into the aluminum film. M. Nishikawa U.S. Pat. No. 4,857,484 describes a method of ion implanting silicon ions into aluminium bonding pad at its surface. None of these workers describe a solution to the metal silicide peeling problem as described above.

It is therefore an important object of this invention to provide a method for fabricating integrated circuits which overcomes this peeling problem and raises yields by using an ion implantation technique.

SUMMARY OF THE INVENTION

In accordance with the present invention, a method is described for fabricating a lightly doped drain MOSFET integrated circuit device which overcomes the problems described above in prior integrated circuit devices. The method begins by forming a pattern of gate electrode structures upon a semiconductor substrate which structures each includes a gate oxide, a polysilicon layer and an amorphous refractory metal silicide. The resulting structure may be annealed in oxygen at this time to change the refractory metal silicide from it deposited amorphous phase into its crystalline phase. This causes the formation of a thin layer of silicon dioxide upon the exposed silicon substrate, the exposed polysilicon layer and the exposed metal silicide layer. A pattern of lightly doped regions in the substrate is formed by ion implantation using the polycide gate structures as the mask. A dielectric layer is blanket deposited over the surfaces. This layer is planned to form the sidewall spacer structures upon the sidewalls of each of the polycide gate structures and over the adjacent portions of the substrate and the cover layer by anisotropic etching. A pattern of heavily doped regions in the substrate is formed by ion implantation using the polycide structures with spacer structures as the mask to produce the lightly doped drain source/drain structures of an MOSFET device. The silicon oxide layer on the top surface of the metal silicate layer was removed by the anisotropic etching step. Silicon ions are now implanted into the metal silicide layer to supply an excess of silicon ions at the surface of the metal silicide layer. The integrated circuit device is completed by forming a passivation layer over the structures described and appropriate electrical connecting structures thereover to electrically connect the gate electrode structures and source/drain elements. This process overcomes the peeling problem presented by the prior art processes.

Further in accordance with the invention, a method for electrically contacting in an integrated circuit manufacturing process a metal silicide conductive line through a passivation glasseous layer is described. An opening is etched through the glasseous layer to the metal silicide conductive line. Either silicon or arsenic ions are now implanted into the exposed metal silicide material. The dosage is greater than about 4 E 15 atoms/square cm. This is a key step in preventing silicide peeling in the subsequent contact reflow step. The structure is now heated to a temperature to cause the glasseous layer to flow and to round off the sharp corners at the surface of the openings. Finally, a conductive contact is formed through the opening in the glasseous layer to the metal silicide conductive line.

DESCRIPTION OF THE PREFERRED EMBODIMENTS

Referring now more particularly to FIGS. 1 through 6, there is shown a method for making the lightly doped drain device of the present invention. The first series of steps involve the formation of the dielectric isolation regions for isolating semiconductor surface regions from other such regions in the semiconductor substrate 10. The semiconductor substrate is preferably composed of silicon having a (100) crystallographic orientation. In an effort to simplify the description and the drawings the dielectric isolation between devices have been shown schematically at 11 and will not be described in detail, because it is conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide 11 as shown in the FIG. 1. Then semiconductor devices can be provided in the silicon mesas according to the following processes.

The surface of the silicon substrate 10 is thermally oxidized to form the desired gate oxide 12 thickness. The preferred thickness is between about 0.225 to 0.275 micrometers. The polysilicon layer 14 is blanket deposited by pyrolyzing silane between about 575° and 650° C. as is conventionally done. The preferred thickness of the polysilicon layer 14 is between about 0.225 to 0.275 micrometers. The polysilicon layer 14 is doped with POCl under the conditions of 850° C. for about 10 minutes of a soaking and 30 minutes of a drivein. The resulting surface is cleaned with a standard cleaning solution for polysilicon.

Figure 1:
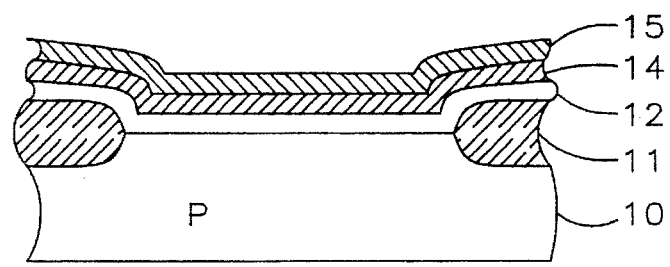
FIG. 1 through FIG. 6 schematically illustrate the method for making a lightly doped drain MOS FET polycide gate integrated circuit of the invention.
Figure 2:
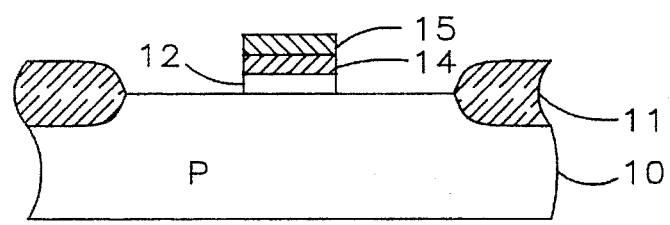

An amorphous refractory metal silicide layer 15 is deposited using low pressure chemical vapor deposition over the polysilicon layer 14 to produce the FIG. 1 structure. The amorphous layer 15 has a chemical formula of $MSi_x$ where M is the refractory metal and x is between 2.6 to 2.7. It is desirable to have x in this range for diminishing film stress. The preferred metal silicide is tungsten silicide and the preferred deposition conditions are a gas flow of tungsten fluoride and silane at a temperature of about 360° C. and pressure of about 200 mTorr. in a suitable reactor. The flow rate of the silane is preferred to be about 2000 sccm. The thickness of the metal silicide is between about 0.225 to 0.215 micrometers and the preferred thickness is 0.25 micrometers. Conventional lithography and etching is now used to form a lithographic mask over the polycide layered structure. The mask pattern protects the designated areas to be the polycide gate structures. The masked structure is now exposed to a plasma etching ambient of for example, $SF_6/C_2F_6$ under a pressure of about 250 mtorr. to remove the unwanted portions of the polysilicon layer 14 and refractory metal silicide layer 15. The mask is now removed to produce the FIG. 2 structure.

Figure 3:
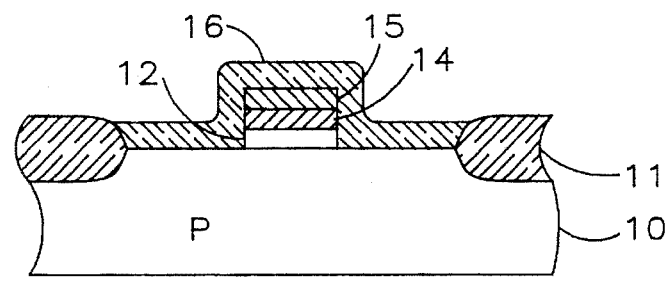

The resulting polycide structure is thermally oxidized at this stage of the process and which will cause the crystallization of the refractory metal silicide. The oxidizing temperature is less than about 950° C. and preferably about 920° C. for about 30 minutes or less. The silicon oxide 16 that is formed upon the polycide structures 14, 15 is about 400 Angstroms and about 150 Angstroms on the exposed silicon substrate 11. This structure is shown in FIG. 3. This silicon oxide is left on the polycide top surface until the subsequent spacer etching which is often a 25% overetching step. The overetching will then remove this oxide layer.

Figure 4:
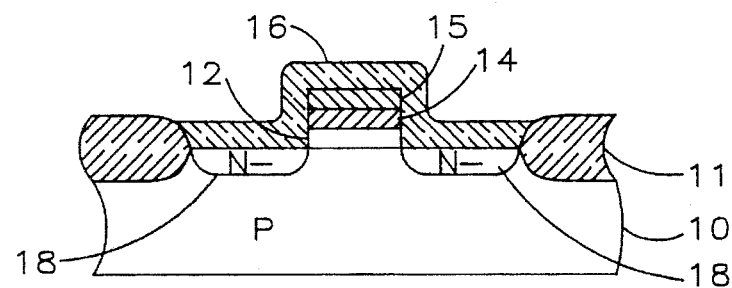
Figure 5:
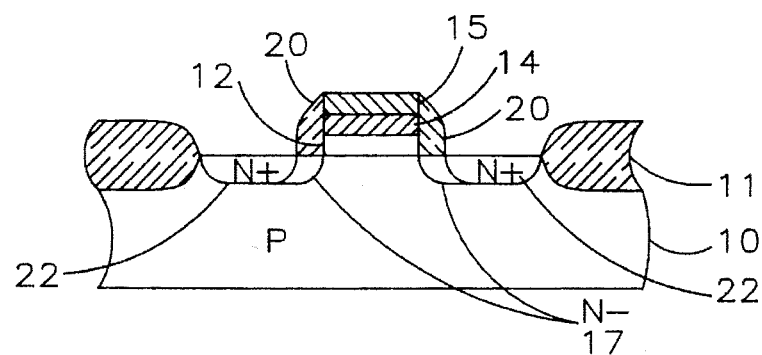
Figure 6:
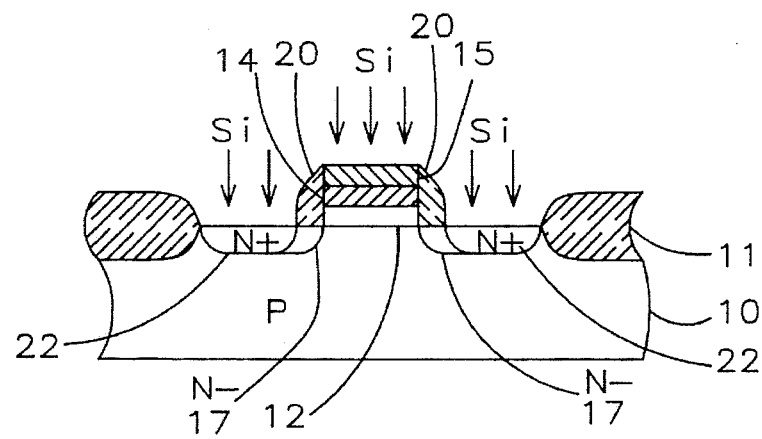

The source/drain structure of the MOS FET may now formed by the following steps. The FIGS. 4 through 6 illustrate the formation of an N channel FET integrated circuit device. However, it is well understood by those skilled in the art that a P channel FET integrated circuit device could also be formed by simply substituting opposite polarities to those given far the N channel embodiment. Also, a CMOS FET could in a similar way be formed by making both N channel and P channel devices upon the same substrate. Of course, it may be desirable to form N or P wells as is known in the art in making such CMOS PET integrated circuit devices.

FIG. 4, for example shows the ion implantations of N– dopants. Lithographic masks (not shown) may be required to protect the areas not to be subjected to that particular N– ion implantation. The formation of the lithographic masks are done by conventional lithography and etching techniques. The N– lightly doped drain implantation 18 is done with for example phosphorous P31 at a dose of 2 E 13 square cm. and with an energy of 75 Kev. The N– regions may be driven in using a thermal cycle in oxygen at less than about 950° C. and preferably 920° C. for 20 minutes.

The dielectric spacer 20 will now be formed followed by the completion of the lightly doped drain source/drain structures and may be better understood with reference to FIGS. 4 through 6. A low temperature silicon dioxide deposition is preferred such as through the chemical vapor deposition of tetraethoxysilane (TEOS) at a temperature in the range of between about 650° to 750° C. However, it is generally preferred to have the spacer formation layer at the 700° C. The thickness of the dielectric silicon dioxide layer is between about 2250 to 2750 Angstrom and preferably 2500 Angstroms.

An anisotropic etching of this layer produces the dielectric spacer layer 20 on the sidewalls of the polycide structures 14, 15. The preferred anisotropic etching uses a plasma dry etching apparatus with carbon hydrogen trifluoride and helium gases to etch the layer of silicon dioxide at a pressure of about 3 Torr.

The exposed silicon oxide layer 16 on the silicon substrate and the top surface of the metal silicide layer is also removed along with the unwanted portions of layer 20 by the reactive ion etching as can be seen by the FIG. 5. The lithographic mask 19 is removed by, for example plasma ashing in oxygen as is well known in the art.

Referring now to FIG. 5, the N+ source/drain ion implantation uses, for example Arsenic, As75 with a dose of 5 E 15 square cm. and energy of about 140 Kev. to complete the source/drain regions 22 of the N channel lightly doped drain MOS FET integrated circuits device.

As seen in FIG. 6, the most important step of the process for preventing the peeling problem of the metal silicide layer is accomplished. Silicon ions are implanted into the surface of the structure. The metal silicide layer is subjected to a dosage of between about 5 E 14 to 1 E 15 atoms/square cm. at 80 to 120 Kev. The structure is then annealed in either nitrogen or an oxidizing atmosphere, such as air. Silicon ions are located at or near, within about 1000 Angstroms of the surface of the refractory metal silicide layer. These silicon ions function as the source for the silicon atoms at the surface which are consumed in the subsequent oxidation or annealing steps. Thereby, drastic change in silicon to metal atomic ratio or stress can be avoided. The result is that the metal silicide does not peel.

The passivation layer (not shown) is now deposited over the upper surfaces of the FIG. 6 structure. The appropriate connections now have to be made to electrically connect the various gate electrodes and source/drain elements to form the integrated circuit device. The contact (not shown in FIG. 6) to the source/drain elements requires a contact etching step that forms openings to the source/drain elements through the passivation layer.

Figure 7:
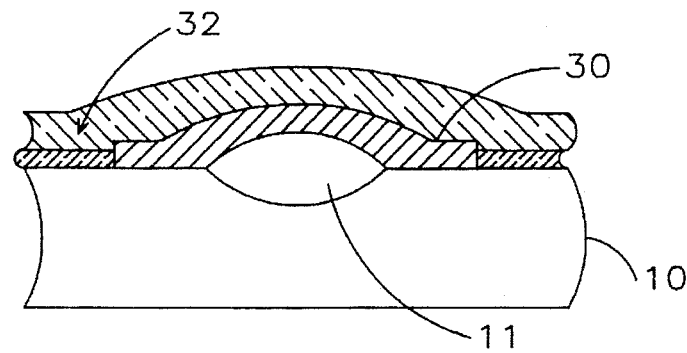
FIG. 7 and FIG. 8 schematically illustrate the method for contacting a metal silicide conductive line through a passivation glasseous layer.
Figure 8:
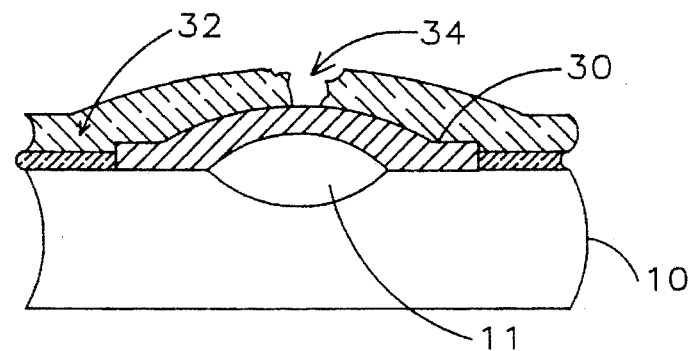

The FIG. 7 and FIG. 8 do show the passivation layer 32 over an area of the integrated circuit other than the field effect transistor area. These FIGS. 7 and 8 show a conductive line 30 composed of polycide, that is polysilicon and metal silicide over a dielectric isolation region 11. The passivation glasseous layer 32 covers the polycide structure.

The preferred process for forming the passivation layer 32 is by forming in a continuous deposition, a layer of between about 900 to 1100 micrometers silicon dioxide and a second layer of between about 6000 to 9000 micrometers borophosphosilicate glass under eithr the conventional atmospheric pressure chemical vapor deposition or plasma emhanced chemical vapor deposition process.

The glasseous composite layer is flowed by heating the structure to between about 850° to 920° C. in nitrogen or steam atmosphere for between about 25 to 30 minutes. This planaraizes the surface of the structure to produce FIG. 7.

Openings are required to be made to the polycide conductive line 30. These are made by etching, such as a combination of a wet and a dry etching. An example of this process uses isotropic etching with water to hydrofluoric acid in a ratio of 10:1 with buffering followed by an anisotropic etching in a carbon tetraflouride/oxygen plasma to form openings 34, in the passivation layer 32 to the metal silicide conductive line 30. Either arsenic or silicon ions are now implanted into the contact area of the polycide before an glass reflow step is made. The implant dosage is greater than about $4 \times 10^{15}$ at an energy of between about 80 to 120 Kev. The implantation presumably offers two functions that is stress relief and the supply of extra silicon atoms. The arsenic implantation has the function of stress relief, while the silicon has both functions indicated.

The structure is now heated to a temperature between about 850° to 920° C. to cause the glasseous layer to flow and to round off the sharp corners at the surface of the said openings. This is generally called reflow.

Appropriate metallurgy (not shown) is now deposited and patterned to electrically connect the gates and source/drain elements, and the conductive lines 30 of FIG. 8 to form the integrated circuit device and. This metallurgy is conventional and may be formed of polysilicon, aluminium, aluminium with dopants of copper and/or silicon, polycide and the like. There is no peeling at the conductive line areas as was experienced in the prior art.

The following Examples are given to point out the important features of the present invention and to aid in the understanding thereof and variations may be made by one skilled in the art without departing from the spirit and scope of the invention.

EXAMPLE I

The tungsten polycide structure of FIG. 1 was formed according to the processes described above. Wafers 2, 3, 4, 5, 6, and 13 were implanted with silicon with the various dosages and energies indicated as follows in Table I.

TABLE I

| wafer | energy(Kev) | dosage(atoms/sq cm.) |
|---|---|---|
| 2 | 80 | 5 E 14 |
| 3 | 80 | 1 E 15 |
| 13 | 80 | 1 E 14 |
| 4 | 120 | 1 E 14 |
| 5 | 120 | 5 E 14 |
| 6 | 120 | 1 E 15 |

The etching of the polycide structure was carried out followed by polycide anneal at 900° C. for 30 minutes. The lightly doped source-drain implantation was done with the polycide structure being the mask. A TEOS layer of about 2500 Angstroms was deposited over the structure. After the spacer structure was formed by anisotropic etching, silicon implantation was done according to the Table II as follows.

TABLE II

| wafer | energy (Kev) | dosage(atoms/sq cm) |
|---|---|---|
| 7 | 80 | 1 E 14 |
| 8 | 80 | 5 E 14 |
| 9 | 80 | 1 E 15 |
| 10 | 120 | 1 E 14 |
| 11 | 120 | 5 E 14 |
| 12 | 120 | 1 E 15 |

The heavily doped source-drain were then formed by arsenic implantation, followed by the source-drain drive-in at about 900° C. for 30 minutes. The results show all films peel except for wafers 8, 9, 11 and 12. Our experiments show that the silicon implantation before the spacer etching is of no use in preventing the peeling problem. The implantation dosage of silicon must greater than about 5 E 14. The implant energy has been found to be of only secondary importance in terms of preventing peeling.

EXAMPLE II

After the polycide gate was formed as described above, a layer of borophosphosilicate glass was deposited thereover to a thickness of about 7500 Angstroms. The contacts were formed by etching with a dilute hydroflouride buffered acid solution and then with an anisotropic etching step. Implantations were made with As or Si or were not made as indicated in Table III.

TABLE III

| wafer | energy(Kev) | dosage(atoms/sq cm) |
| --- | --- | --- |
| 8 | 80 | 8 E 15 As |
| 9 | none | none |
| 11 | 80 | 5 E 14 Si |
| 12 | none | none |

The wafers were then reflowed at 920° C. for 30 minutes. The results show that wailers 8 and 11 do not peel and wafers 9 and 12 do peel.

While the invention has been particularly shown and described with reference to the preferred embodiments, it will be understood by those skilled in the art that various changes in form and details may be made without departing from the spirit and scope of the invention. For example, while the detailed examples of the integrated circuit devices used N channel MOS FET devices, it is obvious to those skilled in the art that P channel devices and CMOS FET devices can also be fabricated as part of this invention. Further bipolar devices can also be added to the integrated circuit device to form BIMOS or BICMOS structures.

What is claimed is:

1. The method for fabricating a lightly doped drain MOS FET integrated circuit device comprising:

forming a pattern of gate electrode structures upon a semiconductor substrate which structures each includes a gate oxide, a polysilicon layer, a refractory metal silicide layer and a silicon oxide layer over top and sidewall portions of the said gate oxide, said polysilicon layer and said refractory metal silicide layer;

forming lightly doped regions in said substrate by ion implantation using said gate electrode structures as a mask;

blanket depositing a low temperature silicon dioxide layer over the surfaces of the gate electrode structures;

etching the said low temperature silicon dioxide layer to form dielectric spacer structures upon the sidewalls of each of said gate electrode structures and over the adjacent portions of said substrate, and to remove the said silicon oxide layer from the top surfaces of said refractory metal silicide layer;

forming heavily doped regions in said substrate by ion implantation using the said gate electrode structures with said dielectric spacer structures as a mask to produce said lightly doped drain under said dielectric spacer structures of an MOS FET device;

ion implanting silicon ions into the top surface of said refractory metal silicide layer to provide extra silicon atoms at the surface of said refractory metal silicide layer; and forming a passivation layer over the said structures and appropriate electrical connecting structures thereover to electrically connect the said gate electrode structures and source/drain elements to form said integrated circuit device.

2. The method off claim 1 wherein the said ion implanting of silicon is at a dosage of between about 5 E 14 to 1 E 15 atoms per square cm. and is annealed at a temperature of between about 850° to 920° C. in an inert atmosphere.

3. The method of claim 1 wherein the said ion implanting of silicon is at a dosage of between about 5 E 14 to 1 E 15 atoms per square cm. and is annealed at a temperature of between about 850° to 920° C. in an oxidizing atmosphere.

4. The method of claim 1 wherein the said refractory metal silicide is deposited in situ by chemical vapor deposition.

5. The method of claim 4 wherein the said refractory metal silicide is tungsten disilicide.

6. The method of claim 5 wherein the thickness of said tungsten disilicide layer is between about 2250 and 2750 Angstroms and the thickness of the said polysilicon layer is between about 2250 and 2750 Angstroms.

7. The method of claim 1 wherein the thickness of the said refractory metal silicide layer is between about 2250 to 2750 Angstroms, the said polysilicon layer is heavily doped and the thickness of said polysilicon layer is between about 2250 to 2750 Angstroms.

8. The method of claim 1 wherein the said lightly doped regions are N− doped and said heavily doped regions are N+ doped to form an N channel MOS FET integrated circuit.

9. The method of claim 1 wherein both P and N lightly doped drain MOS FET integrated circuit devices are formed on said substrate to provide CMOS FET circuit capability within said integrated circuit device.

10. The method of claim 1 wherein the thickness of said low temperature silicon dioxide layer is between about 2250 to 2750 Angstroms, and the said low temperature silicon dioxide layer is formed by low temperature chemical vapor deposition at less than 700° C.

11. The method of claim 1 wherein the said dielectric spacer structures are formed with a low temperature TEOS chemical vapor deposition method and a reactive ion anisotropic etching process is used to produce said dielectric spacer structures.

12. The method of claim 1 wherein after the formation of the gate oxide, the polysilicon layer, and the refractory metal silicide layer, the silicon oxide layer is formed on the top and sidewall portions of the gate oxide, the polysilicon layer and the refractory metal silicide layer by annealing in an oxygen atmosphere, during said annealing the said refractory metal silicide layer is transformed from its amorphous phase to its crystalline phase.

13. The method for fabricating a lightly doped drain MOS FET integrated circuit device comprising:

forming a pattern of gate electrode structures upon a semiconductor substrate which structures each includes a gate oxide, a polysilicon layer, a tungsten disilicide layer and a silicon oxide layer, said silicon oxide layer formed over the surfaces of said gate oxide, said polysilicon layer, and said tungsten disilicide layer by annealing;

forming lightly doped regions in said substrate by ion implantation using said gate electrode structures as a mask;

blanket depositing a low temperature silicon dioxide layer over the surfaces of the gate electrode structures;

etching the said low temperature silicon dioxide layer to form dielectric spacer structures upon the sidewalls of each of said gate electrode structures and over the adjacent portions of said substrate, and removing said silicon oxide layer from the top surface of said tungsten disilicide layer;

forming heavily doped regions in said substrate by ion implantation using the said gate electrode structures with said dielectric spacer structures as a mask to produce said lightly doped drain under said dielectric spacer structures of an MOS FET device;

ion implanting silicon ions into the said tungsten disilicide layer to provide extra silicon at the surface of said tungsten disilicide layer; and forming a passivation layer over the said structures and appropriate electrical connecting structures therover to electrically connect the said gate electrode structures and source/drain elements to form said integrated circuit device.

14. The method of claim 13 wherein the said tungsten disilicide layer has a thickness of between about 2250 to 2750 Angstroms and the said annealing is done at a temperature of less than 920° C. for less than 30 minutes.

15. The method of claim 13 wherein the said dielectric spacer structures are formed with a low temperature TEOS chemical vapor deposition method and a reactive ion anisotropic etching process is used to produce said dielectric spacer structures.

16. Method for contacting in an integrated circuit manufacturing process a metal silicide conductive line through a passivation glasseous layer comprising: etching an opening to said metal silicide conductive line through the said glasseous layer;

ion implanting ions from the group consisting of silicon and arsenic with a dosage of greater than about 5 E 14 to 1 E 15 and 8 E 15 to 1 E 16 atoms/square cm., respectively, into the said exposed metal silicide conductive line;

heating the structure to a temperature to cause the said glasseous layer to flow and to round off the sharp corners at the surface of the said opening; and forming a conductive contact through the said opening in the said glasseous layer to said metal silicide conductive line.

17. The method of claim 16 wherein the said glasseous layer is borophosphosilicate glass and the heating is to a temperature of between about 850° to 920° C. in a nitrogen atomosphere.

18. The method of claim 17 wherein the metal silicide conductive line is tungsten disilicide and the said conductive contact is aluminium.

19. The method of claim 16 wherein said glasseous layer is a composite of silicon dioxide and borophosphosilicate glass and the heating is to a temperature of between about 850° to 920° C. in an inert atmosphere.

* * * * *